(12) United States Patent
Cosand et al.

(10) Patent No.: US 7,573,305 B1
(45) Date of Patent: Aug. 11, 2009

(54) HIGH SPEED DIVIDER CIRCUIT

(75) Inventors: Albert E. Cosand, Agoura Hills, CA (US); Susan Morton, Pittsford, NY (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 12/041,085

(22) Filed: Mar. 3, 2008

(51) Int. Cl.
*H03B 19/00* (2006.01)

(52) U.S. Cl. .................. 327/117; 327/113; 327/114; 327/115; 327/118

(58) Field of Classification Search ......... 327/113–118, 327/355–360, 202, 203, 208–212, 218; 377/47, 377/48
See application file for complete search history.

(56) References Cited

U.S. PATENT DOCUMENTS

| 5,324,997 | A | 6/1994 | Cosand |
| 2001/0022537 | A1* | 9/2001 | Melava et al. ............. 331/16 |

* cited by examiner

*Primary Examiner*—Lincoln Donovan
*Assistant Examiner*—Brandon S Cole
(74) *Attorney, Agent, or Firm*—Ladas & Parry

(57) ABSTRACT

A high speed divider circuit is disclosed. The circuit contains a plurality of latches and buffers. The maximum input clock frequency of the divider circuit is increased over that implemented with only latches connected in a ring by feed forwarding the output of an early switching latch to the output of a later switching latch through buffers. The feed forward signal aids the later switching latch to complete the next state transition. By choosing the appropriate ratio of the buffer tail current to the latch tail current, the divider circuit can be made into a dynamic divider circuit.

5 Claims, 5 Drawing Sheets

HIGH SPEED DIVIDER CIRCUIT

STATEMENT REGARDING FEDERALLY SPONSORED RESEARCH OR DEVELOPMENT

The present invention was made with support from the United States Government under contract AFRL F33615-02-C-1286 (TFAST). The United States Government has certain rights in the invention.

FIELD

The present application relates generally to integrated circuits, and more specifically the invention pertains to a high frequency clock divider circuit.

BACKGROUND

Digital circuits are continually being pressed for higher operating frequencies. In such context, frequency dividers that are implemented with counters consistently suffer from the ripple delays associated with multiple flip-flop stages or latches and logic gates. However, the switching time of the latches limits the clock frequency that can be divided. As the upper limit on clock frequency is limited so is the speed of associated circuits. Logic devices of limited complexity and elevated speed capability are preferred for advanced high-speed digital signal processing applications. These logic circuits require high speed clock divider circuits to preserve the overall speed.

The usual approach to a high speed divider is to cascade divide-by-two sections, each consisting of two D latches connected as a master-slave flip-flop with inverted feedback from the output to the input. Usually, a simple latch circuit is used which slews through a full logic swing on each state transition. A technique to bias such circuits in the direction of the next state transition is described in U.S. Pat. No. 5,324,997, but it does not work as well as a novel high-speed divider circuit presently disclosed.

BRIEF DESCRIPTION OF THE FIGURES

In the following description, like reference numbers are used to identify like elements. Furthermore, the drawings are intended to illustrate major features of exemplary embodiments in a diagrammatic manner. The drawings are not intended to depict every feature of every implementation.

DETAILED DESCRIPTION

The normal approach to a high speed divider or prescaler chain is to start with a divide-by-two to minimize the amount of circuitry that has to run at the highest speed. A subsequent divider circuit operates at a lower frequency and hence at lower power.

Figure 1:
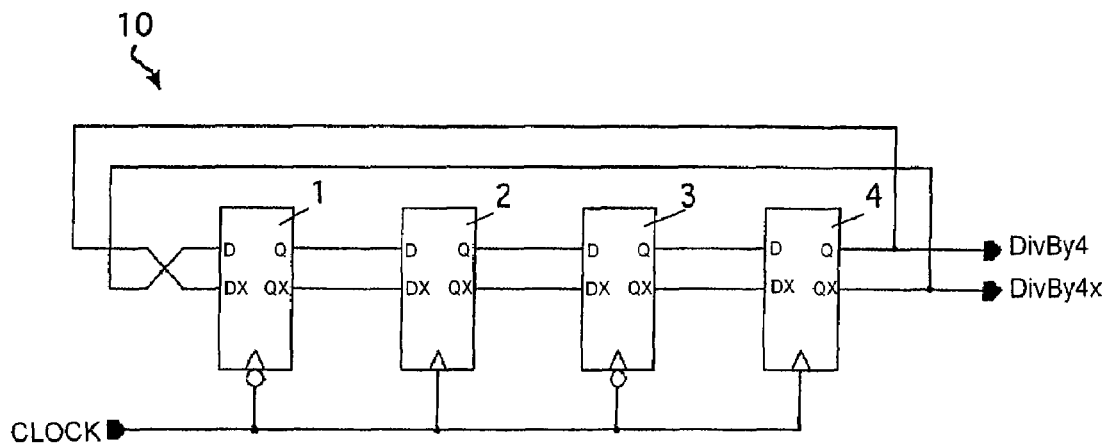
FIG. 1 shows a conventional divide by four circuit as the cascade of two divide by two circuits, each composed of two latches.
Figure 2:
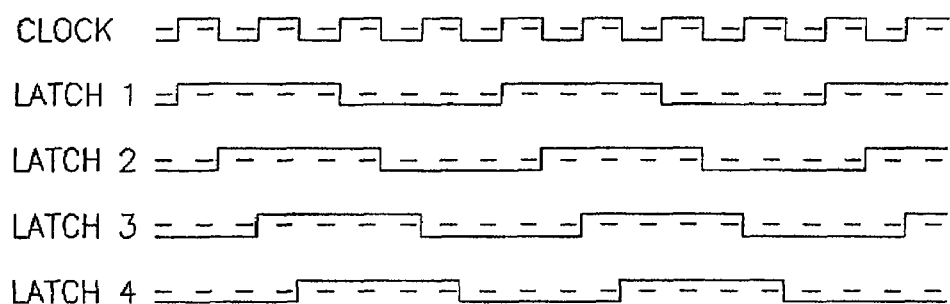
FIG. 2 shows the timing of the divide by four circuit of FIG. 1.

An alternative, prior art, approach is based on a divide-by-four circuit 10 consisting of four latches 1, 2, 3 and 4 chained together in a feedback loop with one inversion, as shown in FIG. 1. The timing for the circuit 10 is shown in FIG. 2. As shown in FIG. 2, when latch 1 is in the same state as latch 4, latch 1 switches on a rising clock edge; latch 2 follows latch 1 on the falling clock edge, and is in turn followed by latch 3 on the next rising edge, then by latch 4 on the falling edge. After two more full clock cycles the latches return to their starting states, completing a divide-by-four cycle. The operating speed is limited by the speed at which a latch can change its state. The voltage swing between the two states affects the speed in two ways. If the output swing is too large the transition speed is limited by the time required for the voltage to slew from one state to the other; on the other hand, there needs to be sufficient voltage at the input to the latch to rapidly charge the parasitic capacitances of the transistors through the parasitic resistances. If the signal levels in FIG. 1 are defined as 1, then the levels in FIG. 2 are $1+f$, $1-f$, $-1-f$, and $-1+f$ where f is between 0 and 1.

Figure 3A:
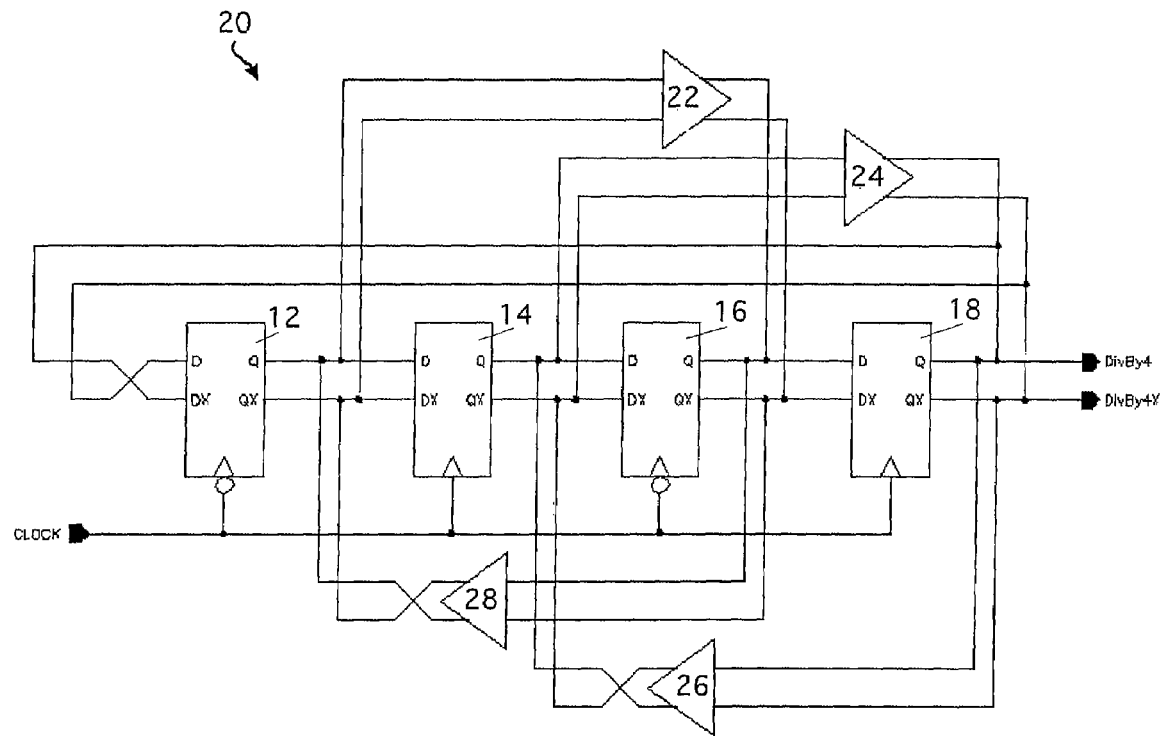
FIGS. 3A and 3B show the divider circuit of the present application.
Figure 3B:
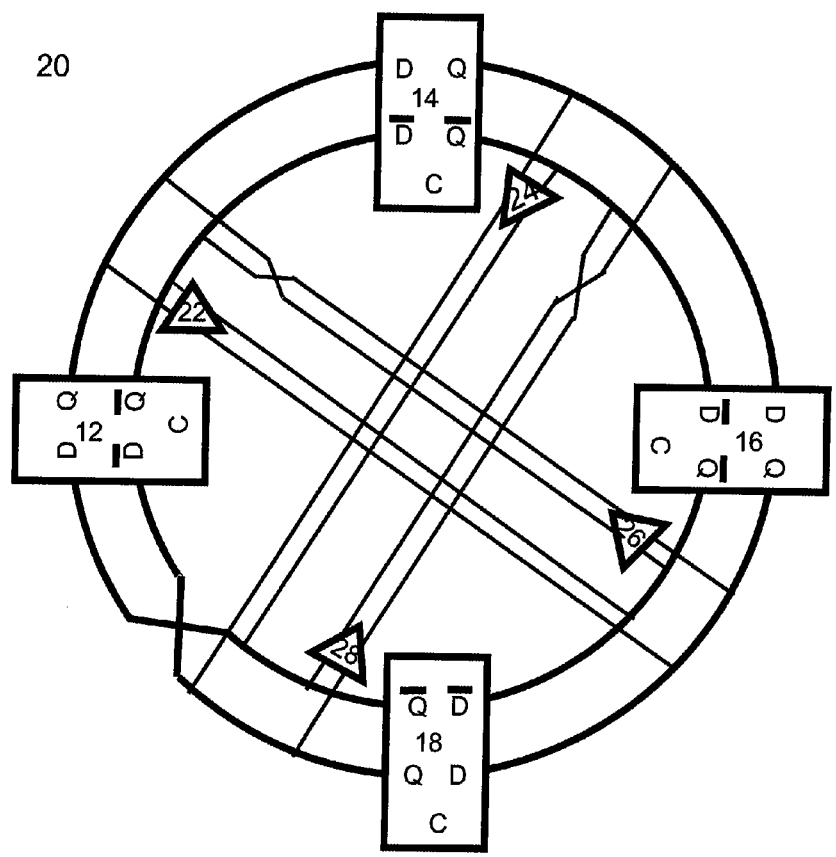

Circuit 20 in FIGS. 3A-3B show one exemplary embodiment according to the present application. According to this embodiment, latches 12, 14, 16 and 18 are connected in a ring with one inversion as shown in FIG. 3B. The output of each latch is fed forward to the output of a corresponding in phase latch, through appropriately phased buffers, to provide additional signal to aid the output of the next latch through its next transition. The feed forward circuitry consists of buffers 22, 24, 26 and 28. The buffers 22, 24, 26 and 28 provide extra drive to the input of each of the latches 18, 12, 14, 16 to switch and to bias each of the latches 18, 12, 14 and 16 respectively toward the state to which it will switch as the signal propagates around the ring. The feedforward connections, connected in the proper phasing shown in FIGS. 3A-3B, allow faster switching, through the increased drive shown in FIG. 4. Proper phasing means the buffer outputs are connected to maintain feed forward as opposed to negative feedback. It is through the use of buffers to feed forward the latch output to the next in phase latch, with the proper phasing, that enables the ring counter to operate at higher clock rates than would otherwise be the case.

Figure 5:
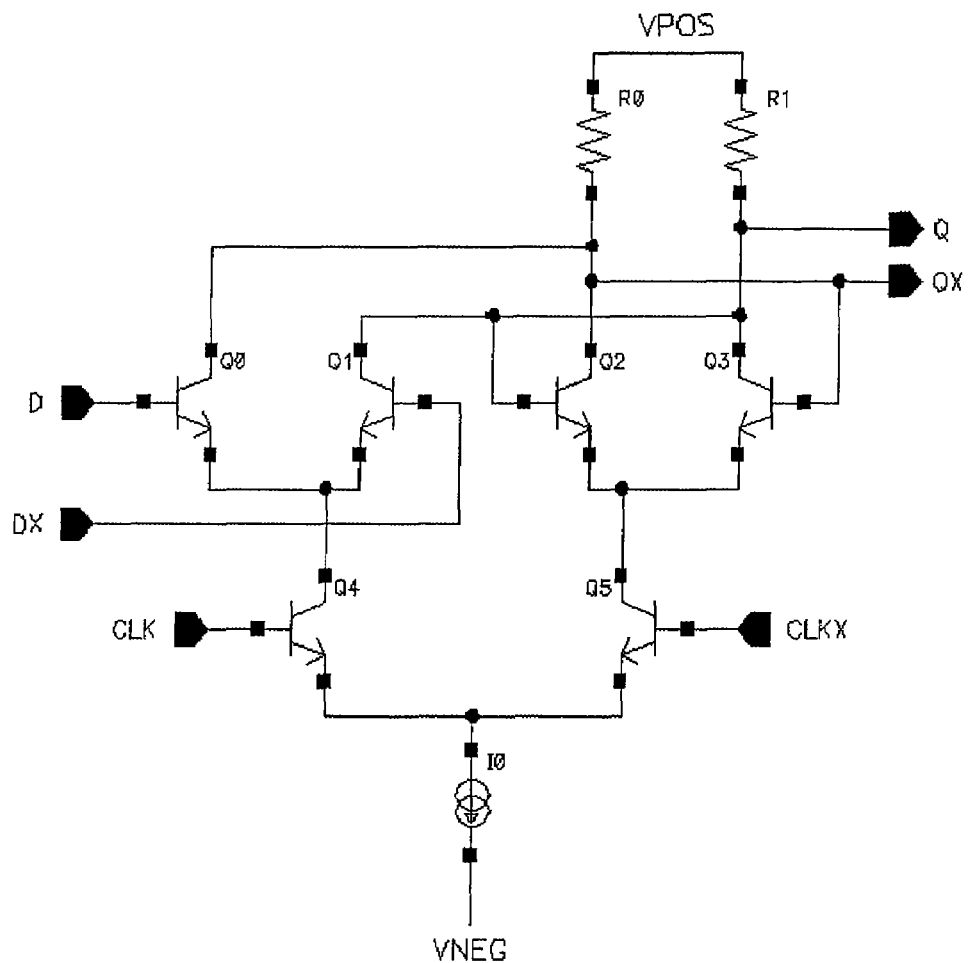
FIG. 5 shows the latch implemented with transistors.
Figure 6:
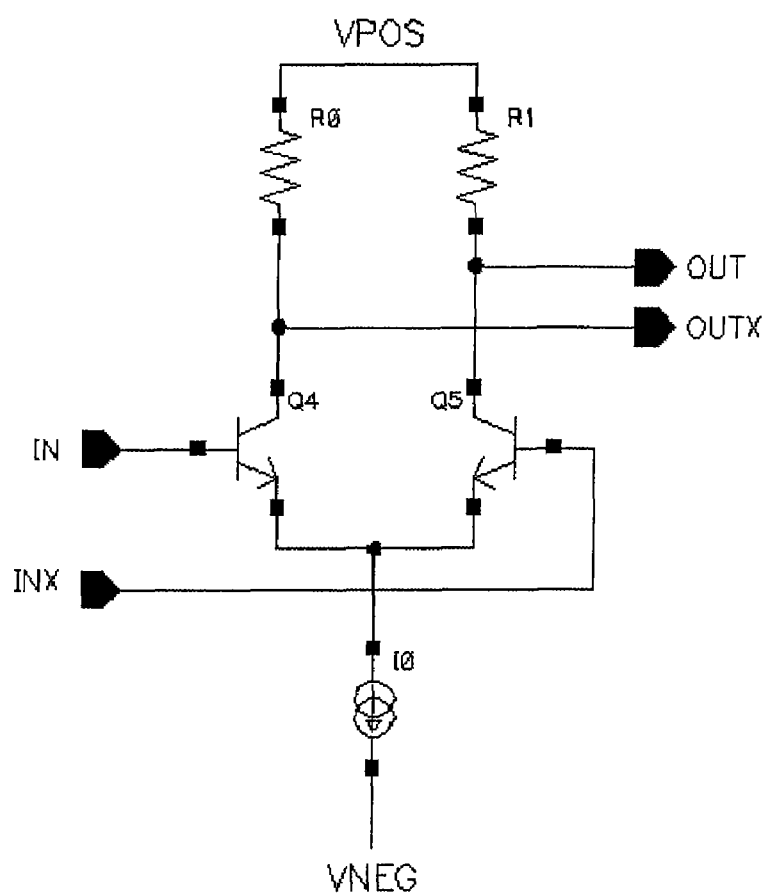
FIG. 6 shows the buffer implemented with transistors.

The presence of the buffers provides an added degree of design flexibility. The buffers 22, 24, 26 and 28 may, for example, contain differential pair of bipolar transistors as shown in FIG. 6 and described below. These buffer transistors have a tail current depicted by the two interlocking rings at the bottom of FIG. 6. The latch in FIG. 5 is typical of conventional latches. The latch also has a tail current. The responsiveness of the ring divider circuit in FIG. 3B depends, in part, on the ratio of the buffer tail current to the latch tail current. If this ratio is zero, the equivalent of the buffers not connected, then the circuit is a static divider circuit. The divider circuit is static in that the signal circulating around the ring is in sync with the clock and will stay that way at low clock frequencies. If the ratio of the buffer tail current to the latch tail current is greater than zero, then the feedforward increases the responsiveness of the circuit so a higher clock frequency can be used. As the ratio continues to increase, the static divider circuit becomes a dynamic divider circuit. A dynamic divider circuit allows a higher clock frequency than a static divider circuit but the divider circuit will stay in sync with the clock only down to a minimum clock frequency. Below that the divider circuit loses sync and oscillates at a frequency not strictly controlled by the clock.

Figure 4:
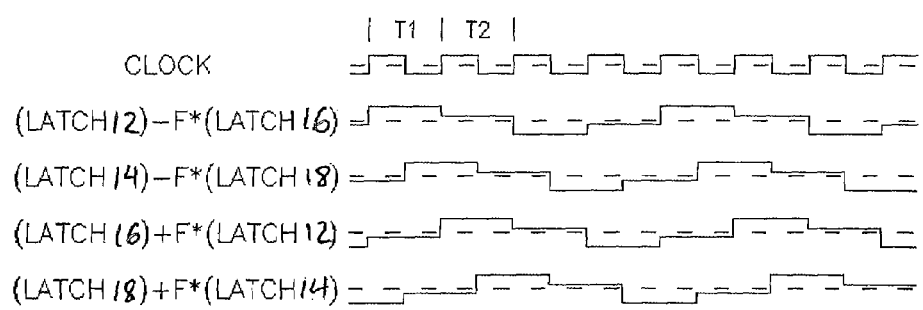
FIG. 4 shows the timing of the divider circuit of FIGS. 3A-3B.

The timing for the circuit 20 is shown in FIG. 4. If a suitable fraction of the output of the latch one clock cycle away is added to the output of each latch, its output voltage can be increased at the time it needs to be large to drive the following latch through a state transition, while at the same time the latch that has to make a transition is biased in the direction that it is to switch so that it can slew across its threshold more quickly. As shown in FIG. 4, during time interval T1 the output of latch 12 is increased so it provides more drive for the transition of latch 14. During time T2, latch 16 has changed state and latch 12 is biased toward threshold so that it can more quickly complete its next transition.

FIG. 5 depicts exemplary transistor level schematics of one of the latches 12, 14, 16 and 18. FIG. 6 depicts exemplary transistor level schematics of one of the buffers 22, 24, 26 and 28. When a buffer output is connected to a latch output in a circuit implemented on a single chip, where the R0 and R1 resistors in the latch circuit is the same as in the buffer circuit, then the load resistors are coalesced into the equivalent parallel resistance of the two. Depending on technology characteristics such as collector saturation or offset voltage, or voltage dependence of junction capacitances, emitter followers may be added for buffering and/or level shifting.

As used in this specification and appended claims, the singular forms "a," "an," and "the" include plural referents unless the specification clearly indicates otherwise. The term "plurality" includes two or more referents unless the specification clearly indicates otherwise. Further, unless described otherwise, all technical and scientific terms used herein have meanings commonly understood by a person having ordinary skill in the art to which the disclosure pertains.

The foregoing detailed description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "step(s) for . . . ."

What is claimed is:

1. A circuit comprising:
   a first latch;
   a second latch with inputs connected to outputs of the first latch;
   a third latch with inputs connected to outputs of the second latch;
   a fourth latch with inputs connected to outputs of the third latch, wherein inputs of the first latch are connected to outputs of the fourth latch;
   a first buffer with inputs connected to the outputs of the first latch and with outputs connected to the outputs of the third latch;
   a second buffer with inputs connected to the outputs of the second latch and with outputs connected to the outputs of the fourth latch and inputs of the first latch;
   a third buffer with inputs connected the outputs of the fourth latch and with outputs connected to the outputs of the second latch; and
   a fourth buffer with inputs connected to the outputs of the third latch and with outputs connected to the outputs of the first latch.

2. The circuit of claim 1 where the buffers are connected to the latch outputs to aid the latch outputs through the next transition.

3. The circuit of claim 1 where the ratio of buffer tail current to latch tail current is sufficiently small to force the circuit to operate as a static divider circuit.

4. The circuit of claim 1 where the ratio of buffer tail current to latch tail current is large enough to force the circuit to operate as a dynamic divider circuit.

5. A method for increasing the operable frequency of a ring divider circuit by adding buffers with non zero gain to connect the output of each latch to a corresponding output of the next inphase latch such that the output of the inphase latch is forced through its transition when a clock input is received.

* * * * *